United States Patent
Lu et al.

(10) Patent No.: US 7,732,312 B2
(45) Date of Patent: Jun. 8, 2010

(54) FUSI INTEGRATION METHOD USING SOG AS A SACRIFICIAL PLANARIZATION LAYER

(75) Inventors: Jiong-Ping Lu, Richardson, TX (US); Yaw S. Obeng, Frisco, TX (US); Ping Jiang, Plano, TX (US); Joe G. Tran, Flower Mound, TX (US)

(73) Assignee: Texas Instruments Incorporated, Dallas, TX (US)

( * ) Notice: Subject to any disclaimer, the term of this patent is extended or adjusted under 35 U.S.C. 154(b) by 420 days.

(21) Appl. No.: 11/338,028

(22) Filed: Jan. 24, 2006

(65) Prior Publication Data

US 2007/0173047 A1 Jul. 26, 2007

(51) Int. Cl.
*H01L 21/44* (2006.01)

(52) U.S. Cl. ............ 438/581; 438/583; 438/663; 257/E29.156

(58) Field of Classification Search .......... 438/592, 438/580–583, 655, 664, 682–683, 663; 257/E29.156
See application file for complete search history.

(56) References Cited

U.S. PATENT DOCUMENTS 5,683,939 A * 11/1997 Schrantz et al. ............ 438/384
6,001,726 A * 12/1999 Nagabushnam et al. ..... 438/618
2005/0179098 A1* 8/2005 Chan et al. ................. 257/412
2006/0006476 A1* 1/2006 Biery et al. ................. 257/382
2006/0228885 A1* 10/2006 Saito .......................... 438/650

OTHER PUBLICATIONS

Jiong-Ping Lu, et al., "An Integration Scheme for Using Silicided Dual Work Function Metal Gates" U.S. Appl. No. 10/851,750, filed May 20, 2004.
Jiong-Ping Lu, et al., "A Method for Manufacturing a Semiconductor Device Having a Silicided Gate Electrode and a Method for Manufacturing an Integrated Circuit Including the Same" U.S. Appl. No. 10/810,759, filed Mar. 26, 2004.
Freidoon Mehrad, et al., "Method to Obtain Fully Silicided Poly Gate" U.S. Appl. No. 11/201,924, filed Aug. 11, 2005.

* cited by examiner

*Primary Examiner*—Hsien-ming Lee
*Assistant Examiner*—Kevin Parendo
(74) *Attorney, Agent, or Firm*—Rose Alyssa Keagy; W. James Brady; Frederick J. Telecky, Jr.

(57) ABSTRACT

A method for making a transistor 20 that includes using a transition metal nitride layer 200 and/or a SOG layer 220 to protect the source/drain regions 60 from silicidation during the silicidation of the gate electrode 90. The SOG layer 210 is planarized to expose the transition metal nitride layer 200 or the gate electrode 93 before the gate silicidation process. If a transition metal nitride layer 200 is used, then it is removed from the top of the gate electrode 93 before the full silicidation of the gate electrode 90.

15 Claims, 12 Drawing Sheets

FUSI INTEGRATION METHOD USING SOG AS A SACRIFICIAL PLANARIZATION LAYER

BACKGROUND OF THE INVENTION

This invention relates to a method of fabricating a semiconductor transistor that has a fully silicided ("FUSI") gate electrode.

DETAILED DESCRIPTION OF THE INVENTION

Figure 1:
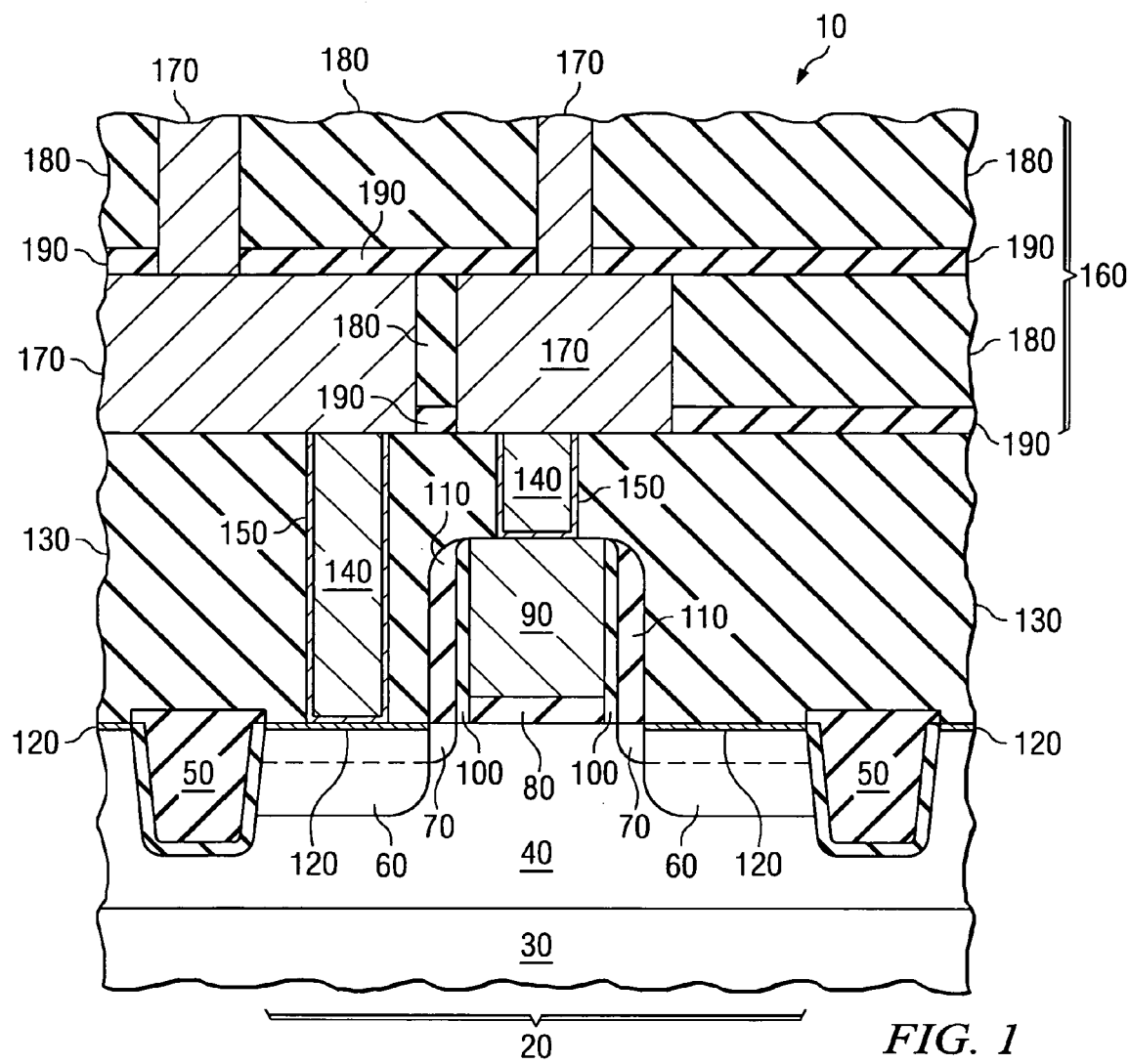
FIG. 1 is a cross-sectional view of a semiconductor structure in accordance with the present invention.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Referring to the drawings, FIG. 1 is a cross-sectional view of a semiconductor wafer 10 in accordance with the present invention. In the example application a CMOS transistor 20 is formed within a semiconductor substrate 30 having an n-well or p-well region 40. The remainder of the semiconductor wafer 10 may contain any combination of active or passive devices (not shown) such as additional CMOS, BiCMOS and bipolar junction transistors, capacitors, optoelectronic devices, inductors, resistors, and diodes.

The CMOS transistor 20 is electrically insulated from other active devices by shallow trench isolation structures 50 formed within the semiconductor substrate 30, 40; however, any conventional isolation structure may be used such as field oxide regions or implanted isolation regions. The semiconductor substrate 30 is any semiconducting material that is doped with n-type and p-type dopants; however it may be an amorphous silicon substrate or a substrate that is fabricated by forming an epitaxial silicon layer on a single-crystal substrate.

Transistors, such as CMOS transistor 20, are generally comprised of a gate, a source, and a drain. More specifically, as shown in FIG. 1, the active portion of the transistors are comprised of source/drain regions 60, source/drain extension regions 70, and a gate stack that is comprised of a gate dielectric 80 and a gate electrode 90. In accordance with the invention, the integration scheme will create a gate electrode 90 that is fully silicided ("FUSI"). The CMOS transistor may be either a p-channel MOS transistor ("PMOS") or an n-channel MOS transistor ("NMOS").

In the example application shown in FIG. 1, the transistor 20 is a PMOS transistor. Therefore it is formed within an n-well region 40 of the semiconductor substrate 30. In addition, the deep source and drain regions 60 and the source and drain extension regions 70 have p-type dopants such as boron. The source/drain regions 60 are usually heavily doped. However, the source/drain extension regions 70 may be lightly doped ("LDD"), medium doped ("MDD"), or highly doped ("HDD"). The PMOS gate stack is created from the oxide gate dielectric 80 and the gate electrode 90 that is comprised of p-type doped polysilicon which has been fully reacted with a transition metal (such as Ni or a Ni alloy).

It is within the scope of the invention for transistor 20 to be an NMOS transistor instead of a PMOS transistor. With this alternative embodiment, each of the dopant types described above would be reversed. For example, if the transistor was an NMOS transistor then it would be formed within a p-well region of the semiconductor substrate. In addition, the deep source and drain regions and the source and drain extension regions would have n-type dopants such as arsenic, phosphorous, antimony, or a combination of n-type dopants. The sources/drain regions of an NMOS transistor are usually heavily doped. However, the source/drain extension regions could be LDD, MDD, or HDD. An NMOS gate stack is created from an n-type doped polysilicon FUSI gate electrode and an oxide gate dielectric. For clarity, this alternative transistor structure will not be discussed in detail since it is well known in the industry how to reverse the dopant types to create an NMOS transistor that is the counterpart to the PMOS transistor described herein.

An offset structure comprising extension sidewalls 100 and spacer sidewalls 110 are used during the fabrication process to enable the proper placement of the source/drain extension regions 70 and the sources/drain regions 60, respectively. More specifically, the extension regions 70 are usually formed using the gate stack 80, 90 and extension sidewalls 100 as a mask. Similarly, the sources/drain regions 60 are usually formed with the gate stack and spacer sidewalls 110 as a mask.

The sources/drain regions 60—as well as other areas of exposed silicon substrate—have a layer of silicide 120 that is formed at some point after the gate electrode is fully silicided. The silicide layer 120 is preferably NiSi; however, it is within the scope of the invention to fabricate the silicide 120 with other metals (such as cobalt, platinum, titanium, tantalum, molybdenum, tungsten, or alloys of these metals). Moreover, the silicide layer 120 that is formed on the top surface of the sources/drain regions 60 may be a self-aligned silicide (i.e. a "salicide")

The gate electrode 90 is fully silicided during the semiconductor fabrication process of the present invention. The FUSI gate electrode 90 has the advantages of low resistance and no poly depletion in comparison to polycrystalline silicon (i.e. "polysilicon" or "poly") gate electrodes. In addition, the fully silicided gate electrode 90 facilitates the reduction of the contact resistance between the transistor 20 and the electrical contacts 140/150. The FUSI gate electrode is preferably comprised of NiSi; however, suicides of other nickel alloys may be used, such as NiYb silicides, NiAl silicides, or NiPt silicides. One advantage of a nickel FUSI gate electrode is that it has a dual work function. In addition, nickel FUSI gate electrodes can be manufactured at relatively low process temperatures and with minimal contamination of the wafer—thereby maximizing manufacturing yields. In accordance with the invention, by using Spin-On-Glass ("SOG") as a sacrificial planarization layer as described below, the shallow source/drain regions 60 are protected during the FUSI processing steps. In a preferred embodiment, a layer of transition metal nitride is also used to protect the shallow source/drain regions 60 during the FUSI processing steps.

Referring again to FIG. 1, a layer of dielectric insulation 130 surrounds the transistor 20 (and also surrounds the other devices on the semiconductor wafer). The composition of dielectric insulation 130 may be any suitable material such as $SiO_2$ or organosilicate glass ("OSG"). The dielectric material 130 electrically insulates the metal contacts 140 that electrically connects the CMOS transistor 20 that is shown in FIG. 1 to other active or passive devices (not shown) that are located throughout the semiconductor wafer 10. An optional dielectric liner (not shown) may be formed over the semiconductor wafer before the placement of the dielectric insulation layer 130. If used, the dielectric liner may be any suitable material such as silicon nitride.

In this example application that is shown in FIG. 1, the contacts 140 are comprised of W; however, any suitable material (such as Cu, Ti, Al, or an alloy) may be used. In addition, an optional liner material 150 such as Ti, TiN, or Ta (or any combination or layer stack thereof may be used to reduce the contact resistance at the interface between the liners 150 and the silicided gate electrode 90 and sources/drain regions 60.

Subsequent fabrication will create the "back-end" portion 160 of the integrated circuit. The back-end 160 is generally comprised of one or more interconnect layers (and possibly via layers) containing metal interconnects 170 that properly route electrical signals and power though out the completed integrated circuit. The metal interconnects 170 may contain any suitable metal such as Cu. In addition, the metal interconnects 170 are electrically insulated by dielectric material 180, which may be any insulative material such as fluorinated silica glass ("FSG") or OSG. Moreover, a thin dielectric layer 190 may be formed between the areas of dielectric material 180 of each interconnect layer. If used, the thin dielectric layer 190 may be comprised of any suitable material, such as SiC, SiCN, SiCO, or $Si_3N_4$. The very top portion of the back-end 160 (not shown) contains bond pads to connect the completed integrated circuit to the device package. In addition, the top of the back-end portion 160 often contains an overcoat layer to seal the integrated circuit.

Referring again to the drawings, FIGS. 2A-2J are cross-sectional views of a partially fabricated semiconductor wafer 10 illustrating a process for forming an example PMOS transistor 20 in accordance with the present invention. Those skilled in the art of semiconductor fabrication will easily understand how to modify this process to manufacture other types of transistors (such as an NMOS transistor) in accordance with this invention. FIG. 3 is a corresponding flow chart illustrating the process flow of the invention.

Figure 2A:
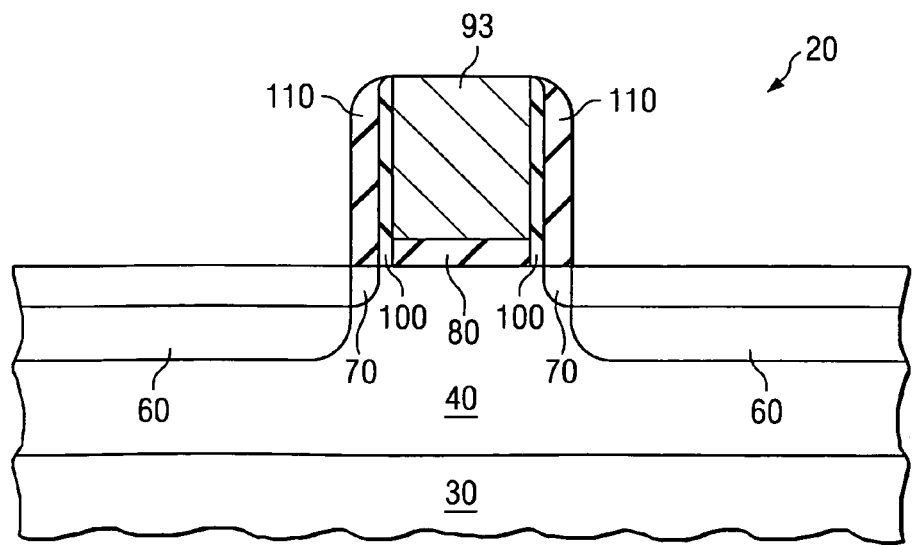
FIGS. 2A-2J are cross-sectional diagrams of a process for forming a transistor in accordance with an embodiment of the invention.
Figure 3:
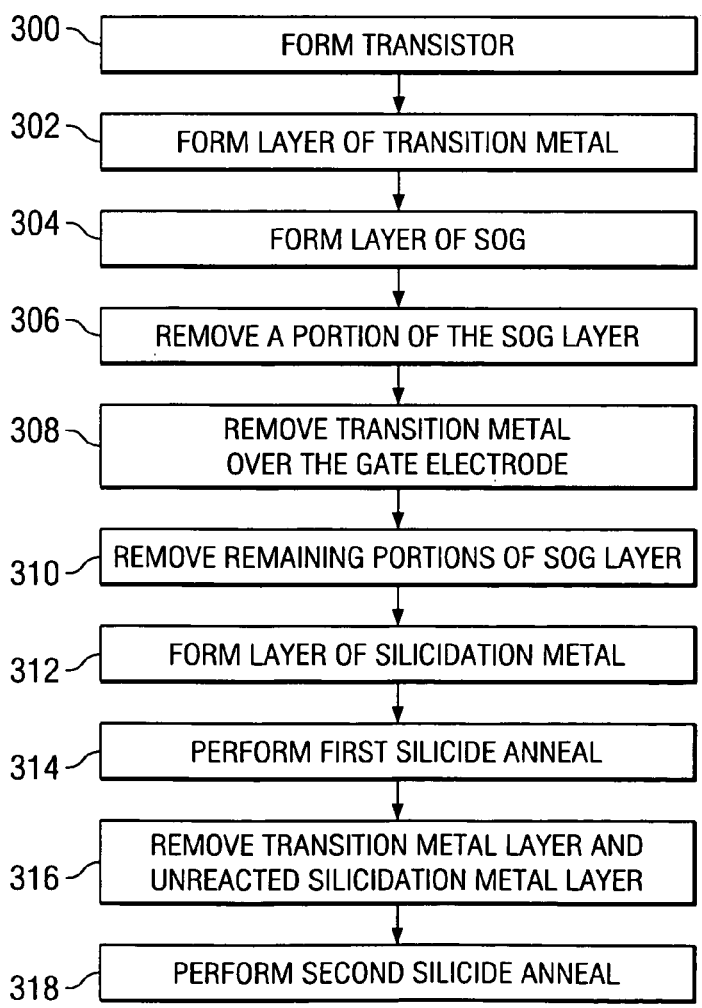
FIG. 3 is a flow chart illustrating the process flow of the invention described in FIGS. 2A-2J.

FIG. 2A is a cross-sectional view of a transistor structure 20 after the formation of a CMOS transistor on the top surface of a semiconductor substrate 30 (step 300). Specifically, the example transistor 20 at this stage in the manufacturing process is comprised of an oxide gate dielectric 80, a polysilicon gate electrode 93, source/drain regions 60 and source/drain extension regions 70. In addition, the transistor 20 has extension sidewalls 100 and spacer sidewalls 110. This PMOS transistor 20 is formed using any manufacturing technique, such as the manufacturing technique described in the commonly assigned patent application having U.S. patent application Ser. No. 11/264,856 (filed Nov. 1, 2005) which is incorporated herein by reference but is not admitted to be prior art with respect to the present invention by its mention in this section.

Figure 2B:
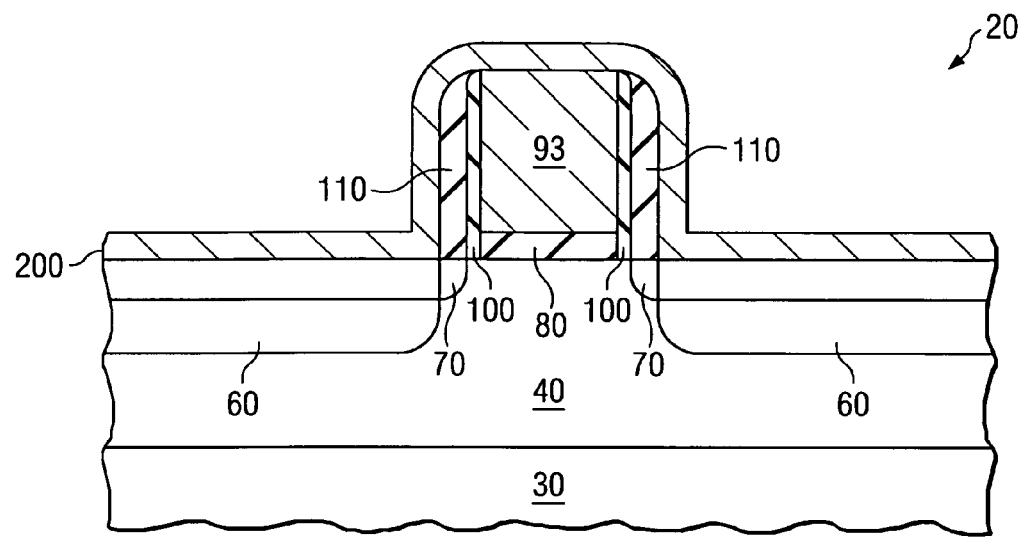

As shown in FIG. 2B, a layer of transition metal nitride 200 is now formed over the surface of the semiconductor substrate 30 (step 302). In this example application, the transition metal nitride 200 is blanket deposited over the semiconductor substrate 30. Preferably, the transition metal nitride is TiN; however other suitable materials may be used, such as TaN, WN, and CrN. The transition metal nitride layer 200 may be deposited by any suitable process such as physical vapor deposition ("PVD") and using any suitable machine such as the Endura (sold by Applied Materials).

Figure 2C:
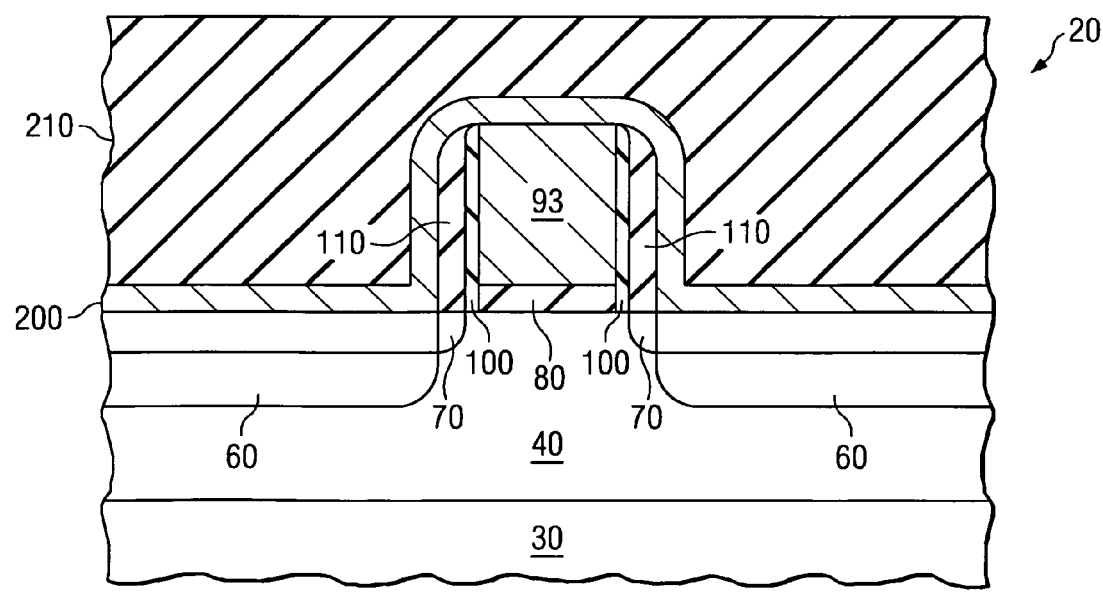

Next, a layer of an inorganic/organometallic precursor 210, such as the precursor that is used for Spin-On-Glass ("SOG"), is formed over the transition metal nitride layer 200 as shown in FIG. 2C (step 304). The SOG layer 210 is a sacrificial planarization layer for the FUSI integration scheme of the present invention. The SOG precursor is spin-coated onto the surface of the semiconductor wafer 10 at any thickness which provides good planarization. When the spin-coating process is complete the wafer is cured at a temperature that is usually below 500° C. (which prevents the de-activation of the dopants that are present in the source/drain regions 60 and the extension regions 70). In the example application, the SOG 210 is Accufill X-T-28 (from Honeywell) and it is 1000-5000Å thick. Any suitable machine may be used for the spin-coating process, such as the Clean Track ACT-8 (sold by TEL).

Figure 2D:
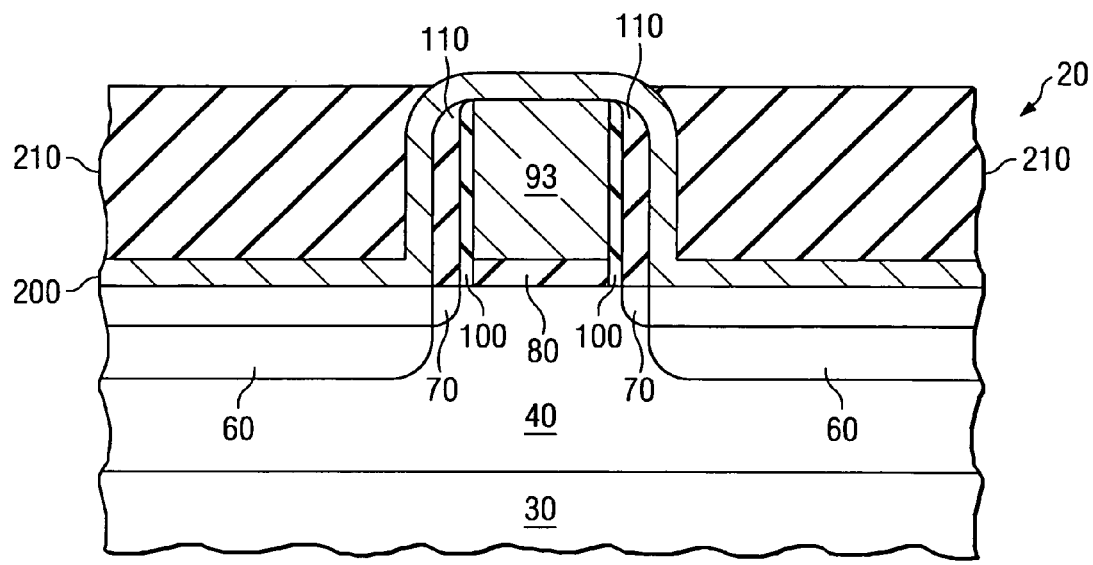

The height of the SOG layer 210 is now reduced to a level that exposes the transition metal nitride layer 200 that is located over the gate electrode 93, as shown in FIG. 2D (step 306). Preferably, the height of the SOG layer 210 is reduced with a dry etch process; however, it is within the scope of the invention to use another suitable manufacturing process such as a chemical mechanical polish ("CMP"). In the example application, an etcher such as DRM (sold by TEL) is used to etch-back the SOG layer 210. In the example application, a selectivity of SOG to TiN as high as >100:1 is obtained with a typical oxide etch chemistry (such as $C_4F_8+N_2+CO+Ar$). If instead the SOG layer 210 is planarized with a CMP process, than any machine such as the Mira (sold by Applied Materials) may be used (with typical CMP slurry).

Figure 2E:
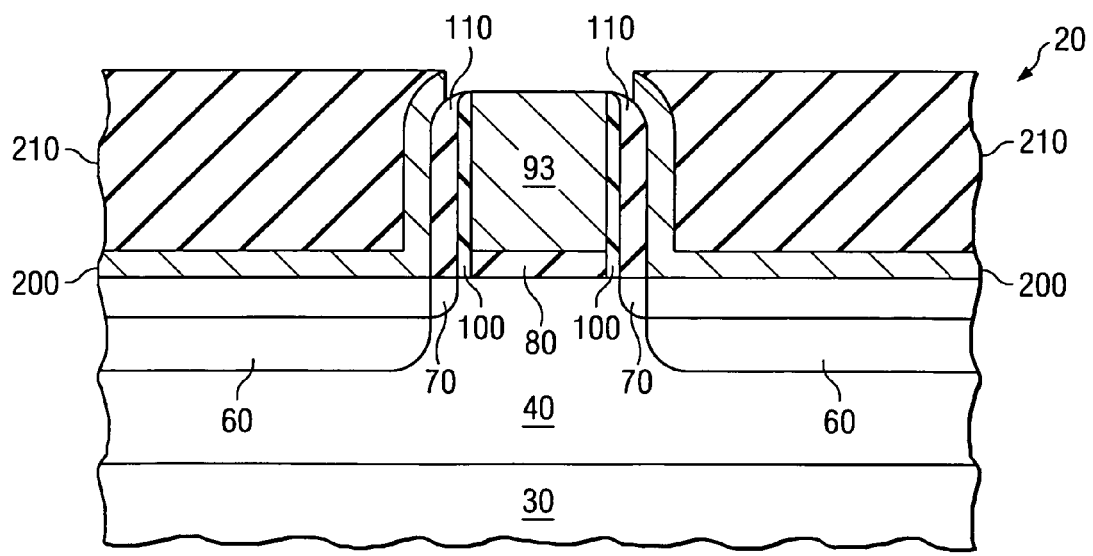

The next step in the fabrication of the PMOS transistor is the removal of the exposed portion of the transition metal nitride layer 200 (step 308). As shown in FIG. 2E, a selective etch will remove the TiN transition metal nitride layer 200 over the polysilicon gate electrode 93 without removing the remaining SOG layer 210. In the example application, a selective wet etch process is performed using a machine such as the Mercury (sold by FSI). Standard etch chemistries such as $NH_4OH+H_2O_2+H_2O$ (commonly called "SC-1") may be used for this wet etch process. Alternatively, another suitable process may be used to remove the transition metal nitride layer 200 over the gate electrode 93, such as a plasma etch process.

Figure 2F:
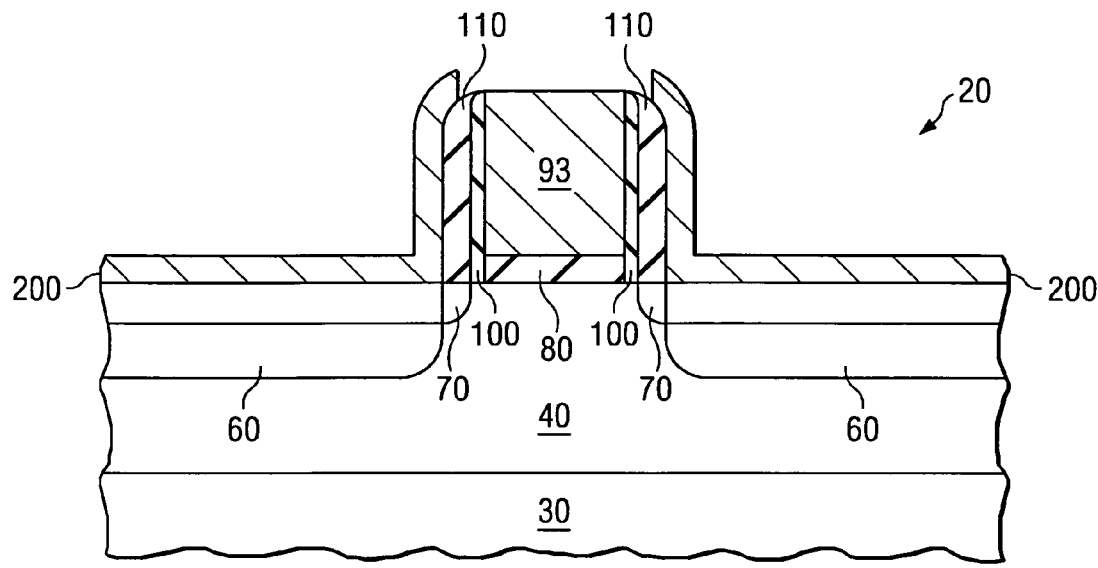

The remaining portions of the SOG layer 210 are now removed, as shown in FIG. 2F (step 310). It is within the scope of the invention to remove the remaining portions of the SOG layer 210 with any suitable process that removes the SOG material without also removing portions of the transition metal nitride layer 200 and the spacer sidewalls 110. In the example application, the process that is used to remove the remaining portions of the SOG layer 210 is a selective etch using a solvent-based etchant, such as NE-14 and a machine such as the SEZ-203 (sold by SEZ of Vilach Austria). An example of this selective etch process is described in the commonly assigned provisional patent application having Provisional Application Ser. No. 60/1757,795 (filed Jan. 10, 2006, and titled "A Highly Selective Wet Etch Method for FUSI Applications") which is incorporated herein by reference but is not admitted to be prior art with respect to the present invention by its mention in this section.

Figure 2G:
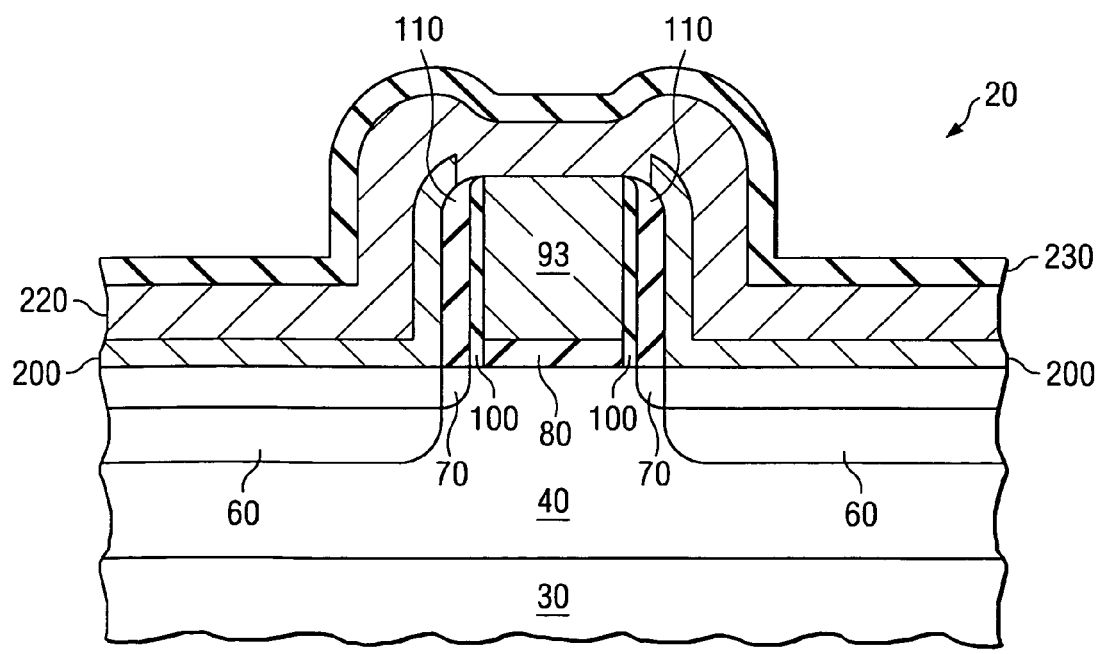

As shown in FIG. 2G, a layer of silicidation metal 220 is now deposited over the top surface of the semiconductor wafer 10 (step 312) using any suitable deposition process such as PVD. The silicidation metal layer 220 is preferably comprised of Ni; however, other nickel alloys may be used, such as NiYb, NiAl, or NiPt. The optimal thickness of the silicidation metal layer 220 is determined by the amount of metal material that is needed to fully silicidize the gate electrode 93. Because it takes approximately 1 nm of nickel to fully silicidize approximately 1.8 nm of polysilicon, the thickness of the silicidation metal layer 220 should be at least 56% of the thickness of the polysilicon gate electrode 93. To be comfortable however, it is suggested that the thickness of the silicidation metal layer 220 should be at least 60% of the thickness of the polysilicon gate electrode 93. Thus, where the thickness of the polysilicon gate electrode 93 ranges from about 500 Å to 1300 Å in the example application, the thickness of the silicidation metal layer 220 should be at least 300 Å to 780 Å, respectively.

An optional cap layer 230 may now be formed over the silicidation metal layer 220, as shown in FIG. 2G. If used, the cap layer 230 acts as a passivation layer that prevents the diffusion of oxygen from ambient into the silicidation metal layer 220. The cap layer 230 may be any suitable material, such as TiN or Ti. In the example application, the cap layer is between 50-500Å thick and it is deposited by a PVD process. Also in the example application, the deposition of both the silicidation metal layer 220 and the cap layer 230 is carried out in a cluster tool, such as the Endura (sold by Applied Materials).

In accordance with the invention, the semiconductor wafer 10 is now annealed with a low temperature spike anneal process (step 314). Suitable machines, such as the Radiance-Plus (sold by Applied Materials) or the Summit (sold by Axcelis) may be used for the low temperature spike anneal process. In the example application, the low temperature spike anneal is performed with a peak temperature less than 550° C. and in a process ambient containing an inert gas such as $N_2$, He, or a combination of inert gases. Preferably, the time above $T_{peak}$ minus 50° C. is 10 seconds or less. The result of this process is an atomic ratio of reacted Ni to polysilicon of $\geq 1$ for the gate electrode 93. This anneal process forms a nickel-rich gate silicide film (i.e. $Ni_2Si$) within the top 60-95% of the gate electrode 93. It is to be noted that the silicidation metal layer 220 will not react with the sources/drain regions 60 because they are protected from silicidation by the previously formed transition metal nitride layer 200.

Figure 2H:
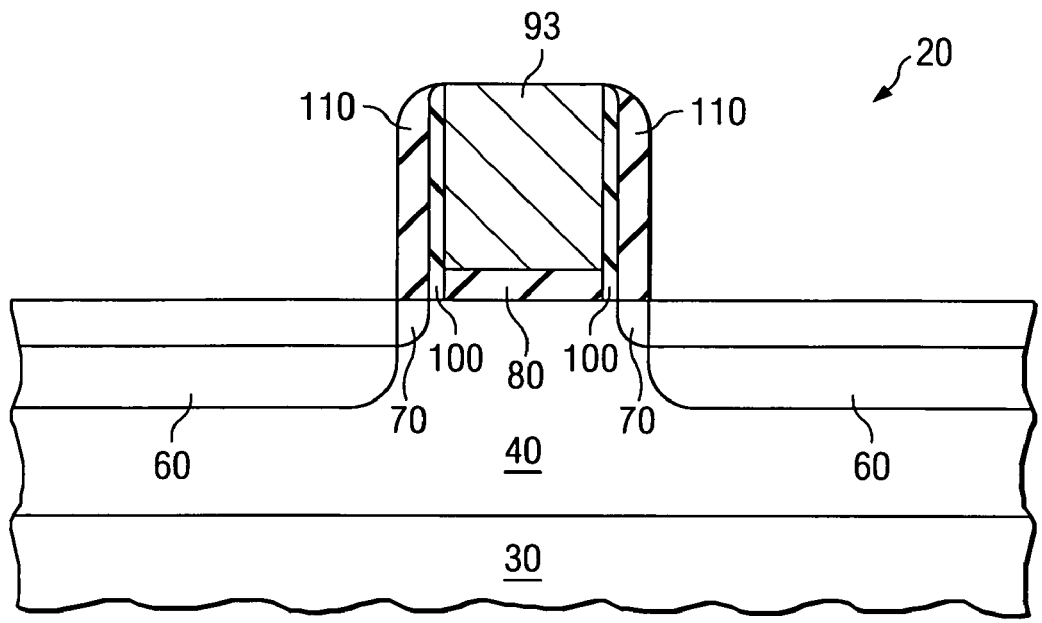

The next step is the removal of the un-reacted portions of the silicidaton metal layer 220 and the remaining potions of the transition metal nitride layer 200, as shown in FIG. 2H (step 316). The silicidation metal layer 220 and the transition metal nitride layer 200 (plus the cap layer 230, if used) are removed with any suitable process such as a wet etch process. In the example application, a selective wet etch process is performed with a machine such as the Mercury (sold by FSI). Standard etch chemistries such as $H_2SO_4+H_2O_2+H_2O$ may be used for this wet etch process.

Figure 2I:
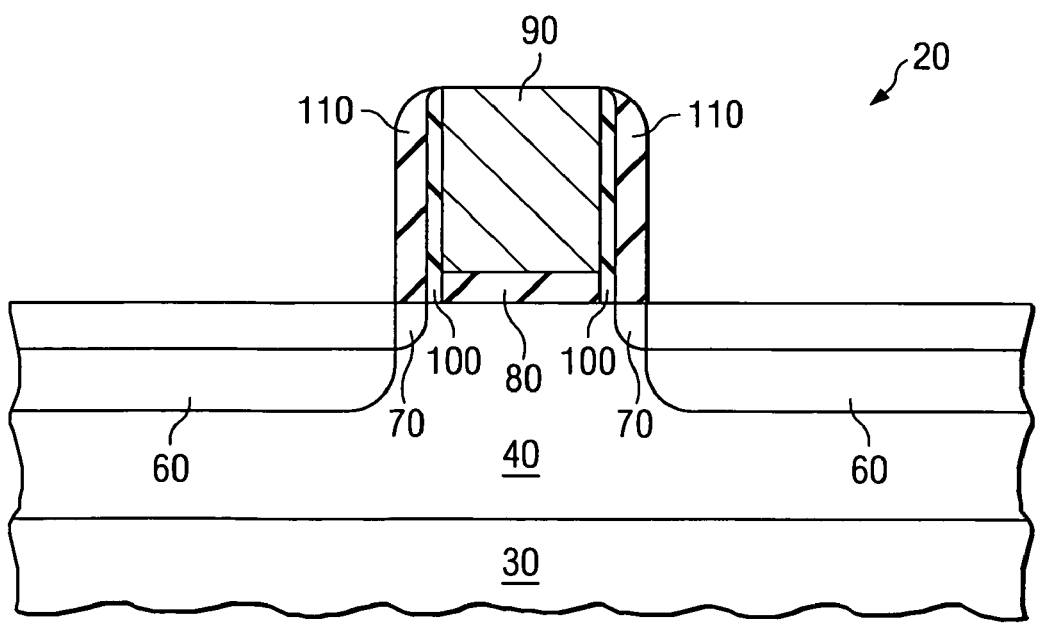

A second silicide anneal is performed at this point in the manufacturing process in order to fully react the partially-silicided polysilicon gate electrode (step 318). In the example application, the second silicide anneal is a standard rapid thermal anneal ("RTA") process that is performed for 10-60 seconds at a temperature between 450-600° C. This second silicide anneal will compete the formation of the FUSI gate electrode 90, as shown in FIG. 2I. It is within the scope of the invention to use alternative processes for the second silicide anneal, such as a spike anneal process with a peak temperature in the range of 500-650° C.

Figure 2J:
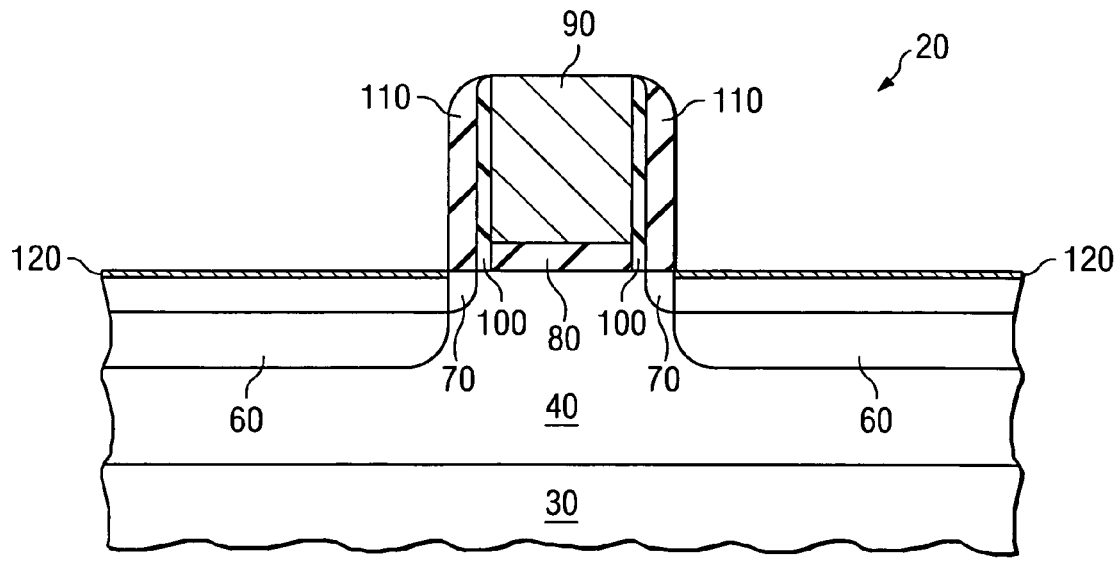

The fabrication of the semiconductor wafer 10 now continues, using standard process steps, until the semiconductor device is complete. As shown in FIG. 2J, the next fabrication step is usually the formation of the silicide layer 120 over the (now exposed) source/drain regions 60 using any suitable process, such as those described in the co-pending applications that have been incorporated by reference above. The fabrication of the integrated circuit then continues until the electronic device is complete.

Alternative integration schemes are within the scope of this invention. For example, as shown in FIGS. 4A-4G, a SOG layer 210 alone may be used to protect the source/drain regions 60 from silicidation during the formation of the FUSI gate electrode 90. The features in FIGS. 4A-4G that are designated with the same reference numbers as those in FIGS. 1-2J represent like or similar features. Moreover, explanations of process steps that are already described above will be shortened or omitted below. FIG. 5 is a corresponding flow chart illustrating the process flow of this alternative embodiment of the invention.

Figure 4A:
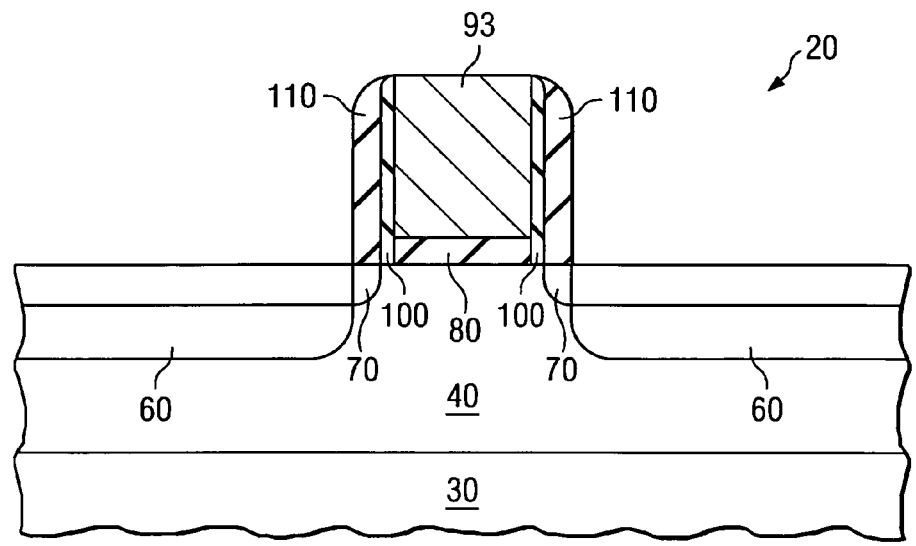
FIGS. 4A-4G are cross-sectional diagrams of a process for forming a transistor in accordance with another embodiment the invention.
Figure 4B:
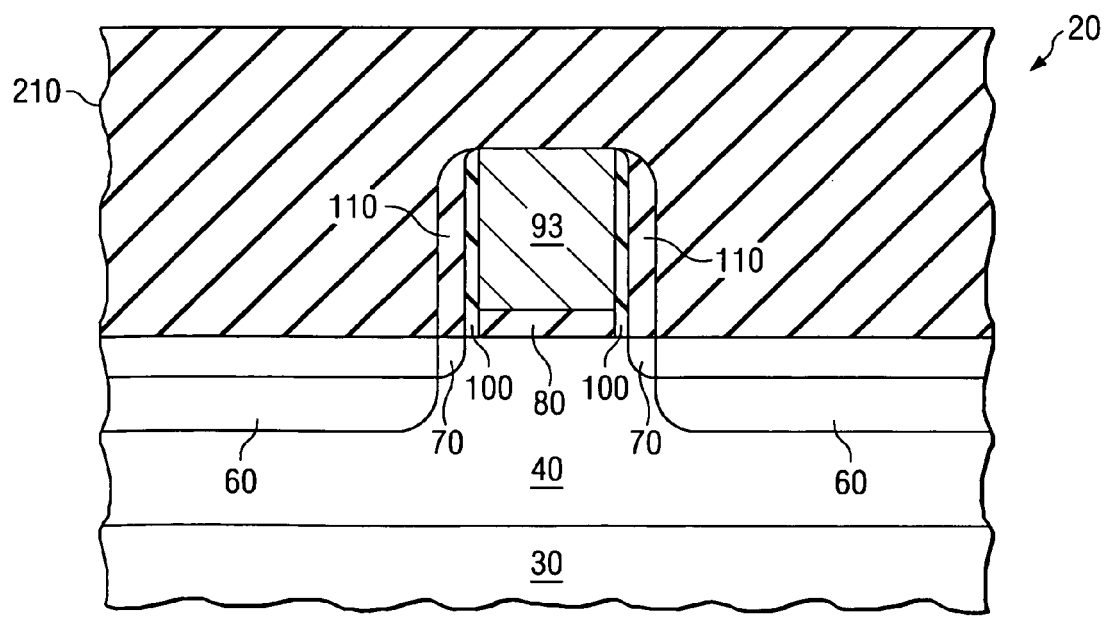
Figure 5:
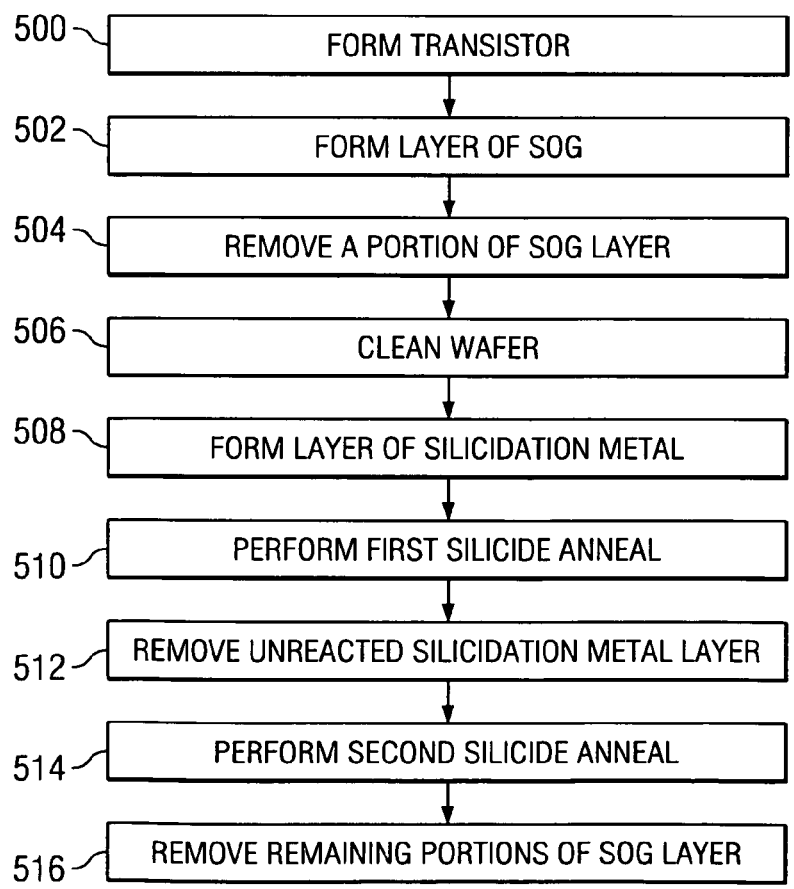
FIG. 5 is a flow chart illustrating the process flow of the invention described in FIGS. 4A-4G.

FIG. 4A is a cross-sectional view of a transistor structure 20 after the formation of a CMOS transistor on the top surface of a semiconductor substrate 30 (step 500). As shown in FIG. 4B, a layer of an inorganic/organometallic precursor 210 such as the precursor used in SOG is formed over the semiconductor wafer 10 (step 502). The SOG precursor is spin-coated onto the surface of the semiconductor wafer at any thickness that is greater than the height of the gate electrode 93 and that also provides good planarization. When the spin-coating process is complete the wafer is cured at a temperature below 500° C. (to prevent the de-activation of the dopants that are present in the source/drain regions 60 and the source/drain extension regions 70).

Figure 4C:
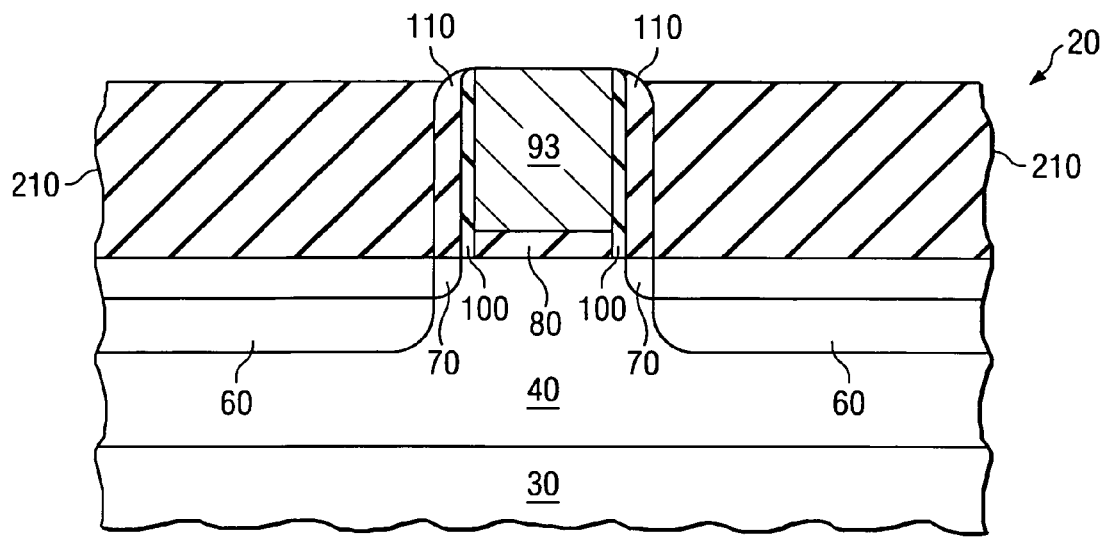

The height of the SOG layer 210 is now reduced to a level that exposes the gate electrode 93, as shown in FIG. 4C (step 504). Preferably, the height of the SOG layer 210 is reduced with a dry etch process; however, it is within the scope of the invention to use another suitable manufacturing process such as CMP. In the example application, an etcher such as DRM (sold by TEL) is used to etch-back the SOG layer 210. Any typical oxide etch chemistry may be used for this SOG etch. If instead the SOG layer 210 is planarized with a CMP process, than any machine such as the Mira (sold by Applied Materials) may be used (with a standard CMP slurry).

The next step in the fabrication of the PMOS transistor 20 is a pre-clean of the semiconductor wafer 10 (step 506). Any suitable process may be used to clean the semiconductor wafer in preparation for the deposition of the silicidation metal layer 220. For example, an Endura machine (sold by Applied Materials) my be used to perform a standard Ar plasma sputter etch of the semiconductor wafer 10.

Figure 4D:
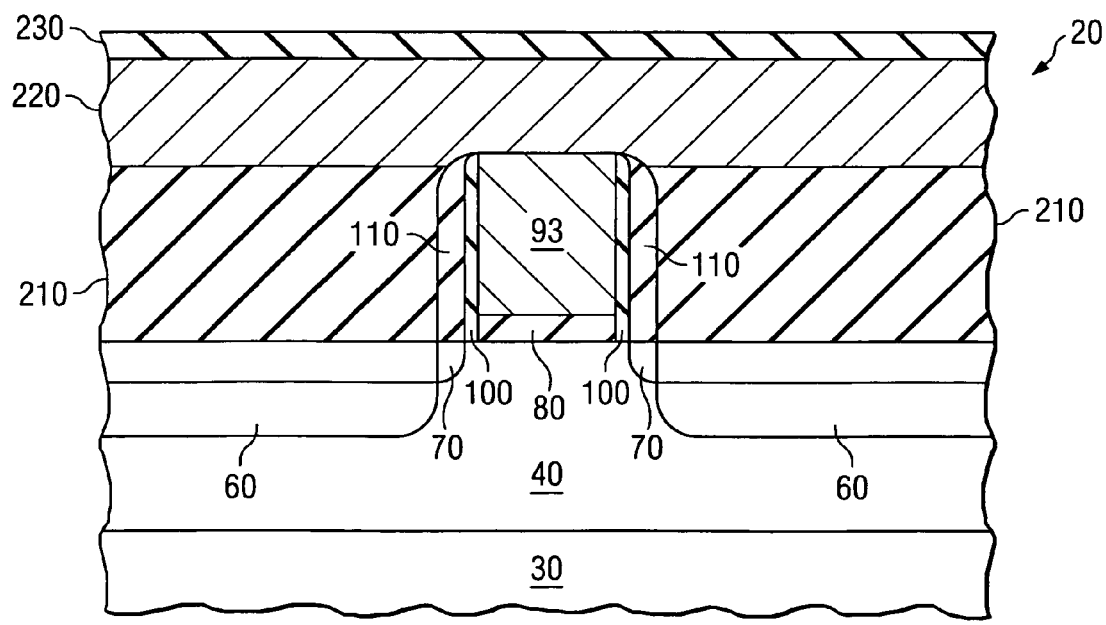

As shown in FIG. 4D, a layer of silicidation metal 220 is now deposited over the top surface of the semiconductor wafer 10 (step 508) using any suitable deposition process such as PVD. The silicidation metal layer 220 is preferably comprised of Ni; however, other nickel alloys may be used, such as NiYb, NiAl, or NiPt. The optimal thickness of the silicidation metal layer 220 is determined by the amount of metal material that is needed to fully silicidize the gate electrode 93.

An optional cap layer 230 may be formed over the silicidation metal layer 220, as shown in FIG. 4D. If used, the cap layer 230 acts as a passivation layer that prevents the diffusion of oxygen from ambient into the silicidation metal layer 220. The cap layer 230 may be any suitable material, such as TiN or Ti.

In accordance with the invention, the semiconductor wafer 10 is now annealed with a low temperature spike anneal process (step 510). Any suitable machine, such as the RadiancePlus (sold by Applied Materials) or the Summit (sold by Axcelis) may be used for the low temperature spike anneal process. In the example application, the low temperature spike anneal is performed with a peak temperature less than 550° C. and in a process ambient containing an inert gas such as N, He, or a combination of inert gases. Preferably, the time above $T_{peak}$ minus 50° C. is 10 seconds or less. This anneal process forms a nickel-rich gate silicide film (i.e. $Ni_2Si$) within the top 60-95% of the gate electrode 93. It is to be noted that the silicidation metal layer 220 will not react with the sources/drain regions 60 because they are protected from silicidation by the previously formed SOG layer 210.

Figure 4E:
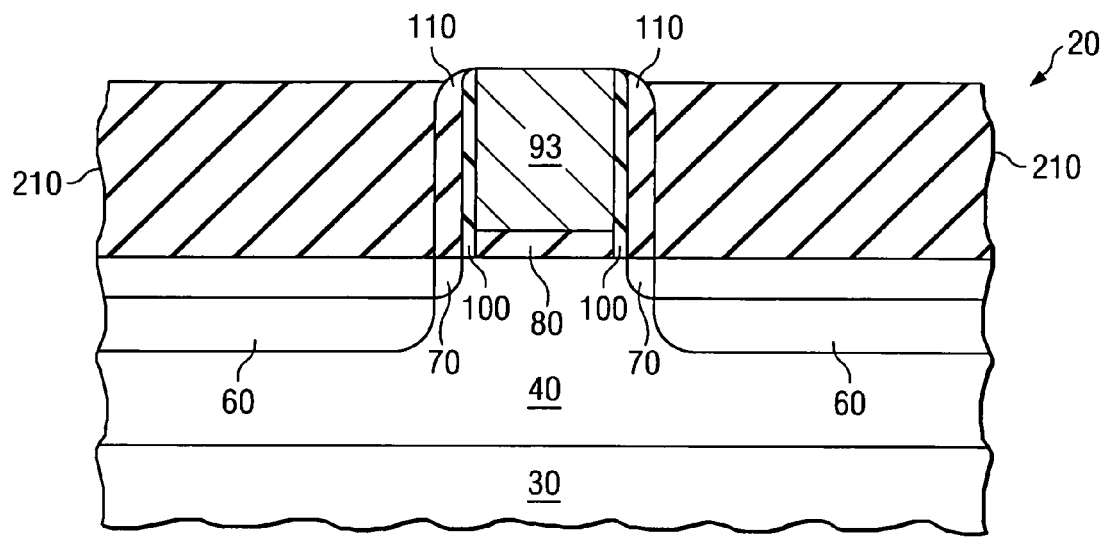

The next step is the removal of the un-reacted portions of the silicidaton metal layer 220, as shown in FIG. 4E (step 512). The silicidation metal layer 220 (and the cap layer 230, if used) is removed with any suitable process such as a wet etch process.

Figure 4F:
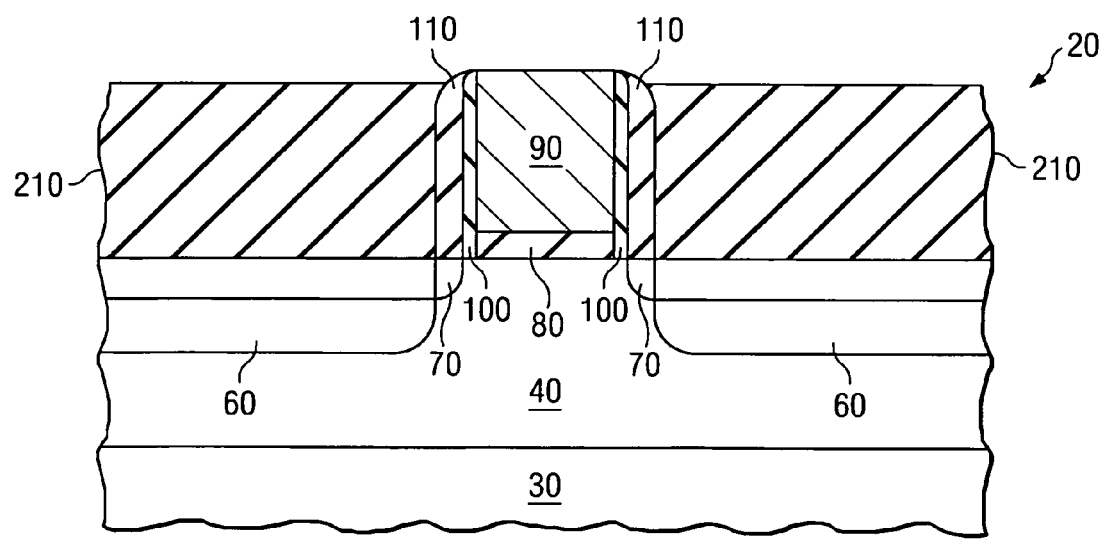

A second silicide anneal is performed at this point in the manufacturing process in order to fully react the partially-silicided polysilicon gate electrode (step 514). In the example application, the second silicide anneal is a standard RTA. This second silicide anneal will compete the formation of the FUSI gate electrode 90, as shown in FIG. 4F. It is within the scope of the invention to use alternative processes for the second silicide anneal, such as a spike anneal process.

Figure 4G:
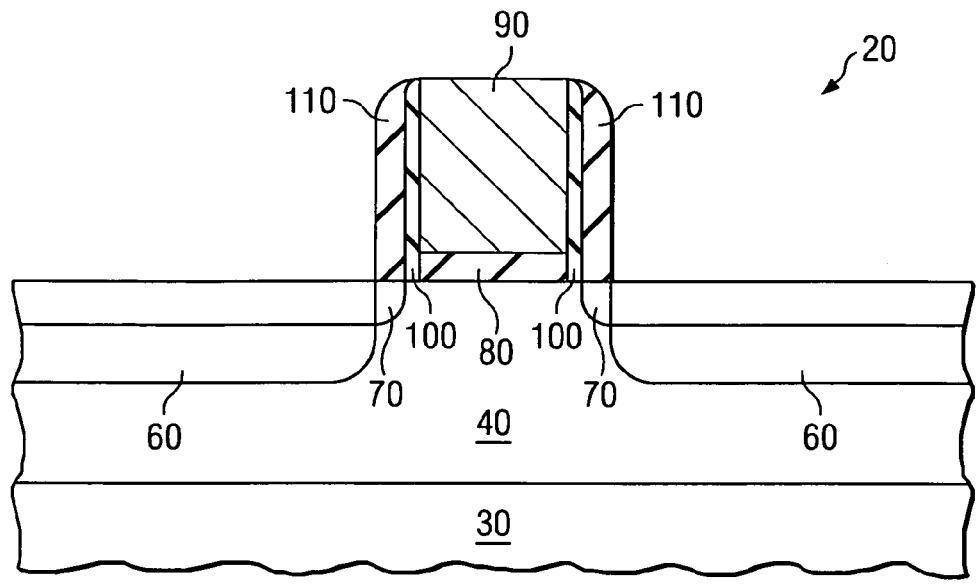

The remaining portions of the SOG layer 210 are now removed, as shown in FIG. 4G (step 516). It is within the scope of the invention to remove the remaining portions of the SOG layer 210 with any suitable process that removes the SOG material without also removing portions of the FUSI gate electrode 90 and the spacer sidewalls 110. In the example application, the process that is used to remove the remaining portions of the SOG layer 210 is a selective etch using a solvent-based etchant, such as NE-14, with a machine such as the SEZ-203 (sold by SEZ). However, another suitable process, such as a wet etch with a dilute HF solution, may be used to remove the SOG 210. The fabrication of the semiconductor wafer 10 now continues, using standard process steps, until the semiconductor device is complete.

Figure 6A:
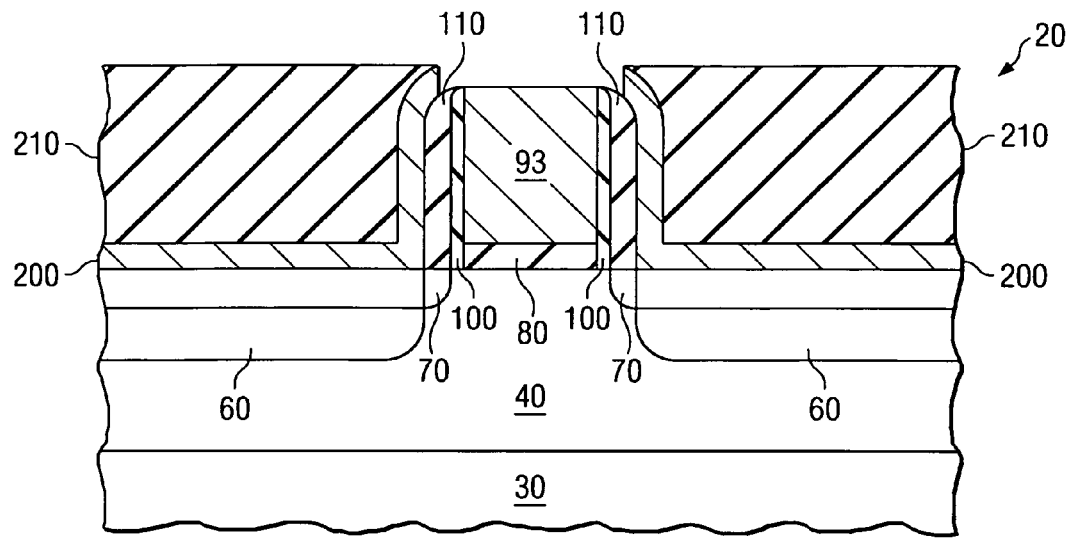
FIGS. 6A-6D are cross-sectional diagrams of a process for forming a transistor in accordance with another embodiment the invention.
Figure 6B:
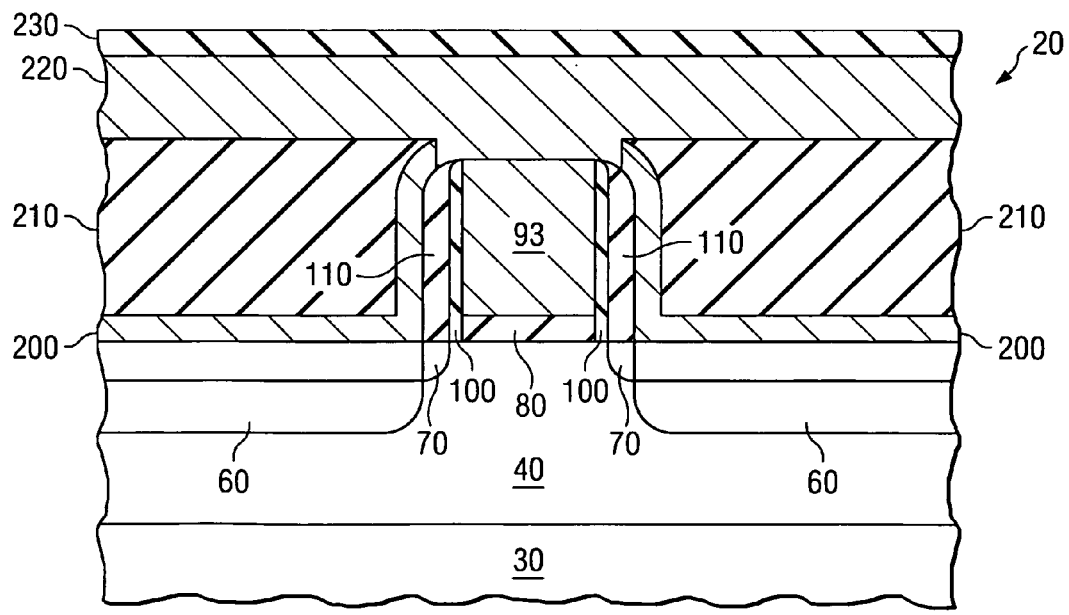

Another embodiment within the scope of the invention is shown in FIGS. 6A-6D. FIG. 7 is a corresponding flow chart illustrating the process flow of this alternative embodiment of the invention. The first part of the integration scheme of this embodiment is similar to steps 300-308 (FIGS. 2A-2E), therefore the explanation of those steps are omitted here. The partially fabricated CMOS transistor 20 at this stage of the manufacturing process is shown in FIG. 6A. As shown in FIG. 6B, a layer of metal 220 is now deposited over the top surface of the semiconductor wafer 10 (step 700) using any suitable deposition process such as PVD. The silicidation metal layer 220 is preferably comprised of Ni; however, other nickel alloys may be used, such as NiYb, NiAl, or NiPt. The optimal thickness of the silicidation metal layer 220 is determined by the amount of metal material that is needed to fully silicidize the gate electrode 93.

An optional cap layer 230 may be formed over the silicidation metal layer 220, as shown in FIG. 6B. The cap layer 230 may be any suitable material, such as TiN or Ti.

In accordance with the invention, the semiconductor wafer 10 is now annealed with a low temperature spike anneal process (step 702). Any suitable machine, such as the RadiancePlus (sold by Applied Materials) or the Summit (sold by Axcelis) may be used for the low temperature spike anneal process. In the example application, the low temperature spike anneal is performed with a peak temperature less than 550° C. and in a process ambient containing an inert gas such as $N_2$, He, or a combination of inert gases. Preferably, the time above $T_{peak}$ minus 50° C. is 10 seconds or less. This anneal process forms a nickel-rich gate silicide film (i.e. $Ni_2Si$) within the top 60-95% of the gate electrode 93. It is to be noted that the silicidation metal layer 220 will not react with the sources/drain regions 60 because they are protected from silicidation by the previously formed transition metal nitride layer 200 (and SOG layer 210).

Figure 6C:
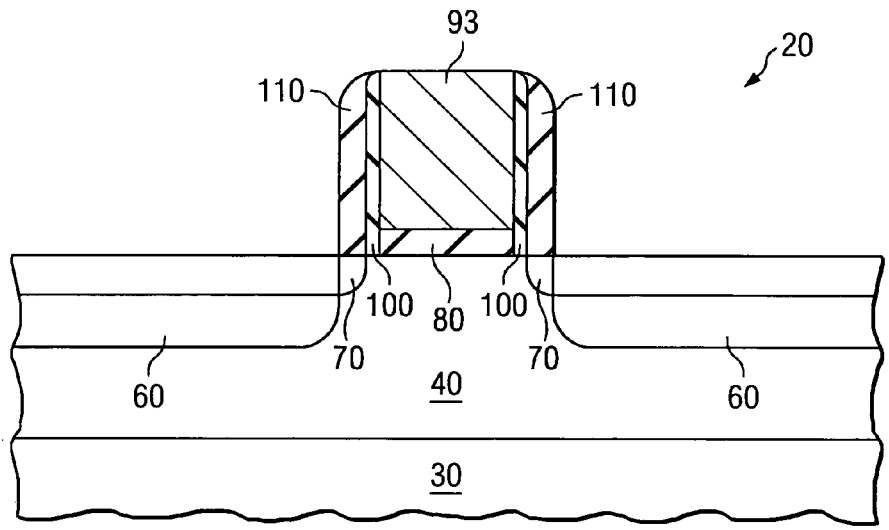
Figure 7:
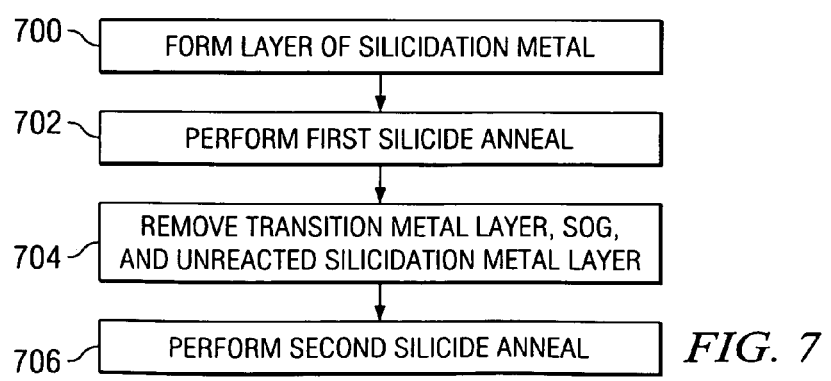
FIG. 7 is a flow chart illustrating the process flow of the invention described in FIGS. 6A-6D.

The next step is the removal of the un-reacted portions of the silicidaton metal layer 220, the remaining SOG layer 210, and the remaining transition metal nitride layer 200 (plus the cap layer 230, if used), as shown in FIG. 6C (step 704). Alternatively, the SOG and transition metal nitride layers 210,200 may be removed in a separate process (than the removal of the un-reacted portions of the silicidaton metal layer 220) after the second anneal (similar to the process of FIG. 5). Any suitable process that doesn't damage the silicided gate electrode 93 and the spacer sidewalls 110 may be used. In the example application, a selective wet etch process is performed using a machine such as the Mercury (sold by FSI). Standard etch chemistries such as $NH_4OH + H_2O_2 + H_2O$ may be used for this wet etch process.

Figure 6D:
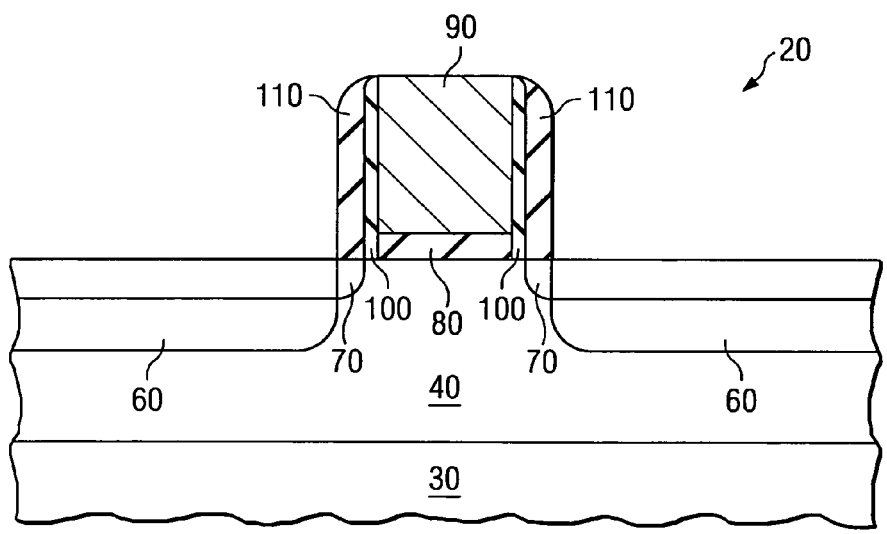

A second silicide anneal is performed at this point in the manufacturing process in order to fully react the partially-silicided polysilicon gate electrode (step 706). In the example application, the second silicide anneal is a standard RTA. This second silicide anneal will compete the formation of the FUSI gate electrode 90, as shown in FIG. 6D. However, it is within the scope of the invention to use alternative processes for the second suicide anneal, such as a spike anneal process. The fabrication of the semiconductor wafer 10 now continues, using standard process steps, until the semiconductor device is complete.

Various additional modifications to the invention as described above are within the scope of the claimed invention. For example, instead of using SOG for the sacrificial planarization layer, other inorganic/organic metallica precursor chemistries may be used, such as SiLK, DUO or ozone TEOS. In addition, an additional anneal process may be performed after any step in the above-described fabrication process. When used, an anneal process can improve the microstructure of materials and thereby improve the quality of the semiconductor structure. Moreover, higher anneal temperatures may be used in order to accommodate transistors having thicker polysilicon gate electrodes. Furthermore, the use of alternative anneal process are within the scope of the invention, such as flash lamp annealing ("FLA") or laser annealing.

While various embodiments of the present invention have been described above, it should be understood that they have been presented by way of example only, and not limitation.

Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A method for making a fully silicided gate electrode, comprising:
    forming a transistor having source/drain regions, sidewalls, and a polysilicon gate electrode;
    forming a layer of transition metal nitride in contact with said source/drain regions, said sidewalls, and said polysilicon gate electrode;
    forming a Spin-On-Glass ("SOG") layer over said source/drain regions, said sidewalls, and said polysilicon gate electrode;
    removing a portion of said SOG layer, wherein said removed portion is the portion of said SOG layer that is located over said polysilicon gate electrode;
    removing a portion of said transition metal nitride layer that is located over said polysilicon gate electrode;
    removing all remaining portions of said SOG layer;
    forming a layer of silicidation metal over said source/drain regions, said sidewalls, and said polysilicon gate electrode;
    performing a first silicide anneal;
    removing all remaining portions of said transition metal nitride layer and unreacted portions of said silicidation metal layer; and
    performing a second silicide anneal to fully silicide said polysilicon gate electrode.

2. The method of claim 1 wherein said silicidation metal layer comprises Ni.

3. The method of claim 1 wherein said transition metal nitride layer comprises TiN.

4. The method of claim 1 further comprising forming a cap layer over said silicidation metal layer prior to said step of performing said first silicide anneal.

5. The method of claim 4 wherein said cap layer comprises TiN.

6. The method of claim 4 further comprising removing said cap layer during said step of removing remaining portions of said transition metal nitride layer and unreacted portions of said silicidation metal layer.

7. The method of claim 1 wherein said step of removing a portion of said SOG layer comprises an etch-back process.

8. The method of claim 1 wherein said step of removing a portion of said SOG layer comprises a CMP process.

9. The method of claim 1 wherein said step of removing said transition metal nitride layer that is located over said gate electrode comprises a wet etch process.

10. The method of claim 1 wherein said step of removing said transition metal nitride layer that is located over said gate electrode comprises a plasma etch process.

11. The method of claim 1 wherein said step of removing all remaining portions of said SOG layer comprises a selective etch process.

12. The method of claim 1 wherein said step of removing remaining portions of said transition metal nitride layer and unreacted portions of said silicidation metal layer comprises a wet etch process.

13. The method of claim 1 further comprising silicidation of said source/drain regions of said transistor.

14. The method of claim 1 wherein said first silicide anneal is a low temperature spike anneal at a temperature that is less than about 550° C.

15. The method of claim 1 wherein said second silicide anneal is a RTA.

* * * * *